United States Patent
Viehmann et al.

(12)
(10) Patent No.: US 6,819,142 B2
(45) Date of Patent: Nov. 16, 2004

(54) CIRCUIT FOR TRANSFORMING A DIFFERENTIAL MODE SIGNAL INTO A SINGLE ENDED SIGNAL WITH REDUCED STANDBY CURRENT CONSUMPTION

(75) Inventors: Hans-Heinrich Viehmann, S. Burlington, VT (US); Stefan Lammers, South Burlington, VT (US)

(73) Assignee: Infineon Technologies Ag, Munich (DE)

(*) Notice: Subject to any disclaimer, the term of this patent is extended or adjusted under 35 U.S.C. 154(b) by 0 days.

(21) Appl. No.: 10/387,733

(22) Filed: Mar. 13, 2003

(65) Prior Publication Data

US 2004/0178828 A1 Sep. 16, 2004

(51) Int. Cl.⁷ ............................................... H03K 19/20
(52) U.S. Cl. ............................ 326/127; 326/52; 326/91
(58) Field of Search ............................ 326/127, 86, 83, 326/115, 104, 90

(56) References Cited

U.S. PATENT DOCUMENTS

| | | | | |
|---|---|---|---|---|
| 6,175,248 B1 | * | 1/2001 | Mack | 326/68 |
| 6,191,619 B1 | * | 2/2001 | Moreland et al. | 326/126 |
| 6,320,406 B1 | * | 11/2001 | Morgan et al. | 326/86 |
| 6,366,128 B1 | * | 4/2002 | Ghia et al. | 326/83 |

* cited by examiner

*Primary Examiner*—Don Le
*Assistant Examiner*—Lam T. Mai
(74) *Attorney, Agent, or Firm*—Slater & Mastsil, L.L.P.

(57) ABSTRACT

An apparatus for converting a differential mode signal into a single ended signal with reduced power consumption. A preferred embodiment comprises a single ended converter (for example, a single ended converter 505) and an output transistor (for example, output transistor 524) that when the single ended converter 505 is in standby may pull the output of the single ended converter 505 to a known logic state (such as high logic or low logic). A single ended buffer (inverting or non-inverting) may be used for output signal compatibility conversion.

33 Claims, 3 Drawing Sheets

CIRCUIT FOR TRANSFORMING A DIFFERENTIAL MODE SIGNAL INTO A SINGLE ENDED SIGNAL WITH REDUCED STANDBY CURRENT CONSUMPTION

TECHNICAL FIELD

The present invention relates generally to logic circuits, and more particularly to an apparatus for transforming differential mode signals into single ended signals with reduced power consumption.

BACKGROUND

When high-speed and low voltage swing data transfer is needed, differential signaling (also commonly referred to as double ended signals), wherein signals are carried on two conductors and the signal is defined as the difference in the two signals. Differential signaling is perhaps the most robust and promising signaling concept. Current mode logic (CML), a design technique commonly used in high speed signaling applications such as communications chips and routers, uses differential signaling.

CML is widely used in high-speed applications due to its relatively low power consumption and low supply voltage when compared to other types of logic, such as emitter coupled logic (ECL). CML is also considerably faster than CMOS logic due to its lower voltage swings. CML also has an added advantage of the capability of being fabricated using CMOS fabrication technology.

One advantage that CMOS logic has over CML is that in a CML circuit, there can be current flow a standby state, while in CMOS logic, no current flows in the standby state. Therefore, CML circuits will typically use more power than CMOS logic circuits.

However, since CML circuits and CMOS logic circuits may be created on the same substrate, it is possible to combine CML and CMOS logic circuits into one design. Thus, the high-speed advantages of CML circuits may be exploited where there is a need for high-speed switching, while CMOS logic's low power consumption is available when the utmost high-speed is not required.

Unfortunately, CML circuits use differential signaling while CMOS logic circuits use single ended signals, wherein signals are carried on a single conductor. Therefore, a conversion between a CML circuit's differential signals to a CMOS logic circuit's single ended signal is needed.

A commonly used solution uses a CML differential mode to single ended mode signal converter with one or more single ended buffers (or inverters) to perform the conversion from differential signaling to single ended signaling. It is typical to turn off the CML circuit's reference current source in order to reduce power consumption when the conversion is not needed or when the overall circuit is in standby.

One disadvantage of the prior art is that when the CML circuit's reference current source is turned off, the gates of the transistors in the single ended buffer are left floating. This may result in an undefined input at the single ended buffer hence an undefined output is present at the output of the single ended buffer.

A second disadvantage of the prior art is that when there is an undefined input at the single ended buffer, it is probable that current will flow when the circuit is in standby since the output of the single ended buffer will change depending on its input. Thereby increasing current consumption.

SUMMARY OF THE INVENTION

These and other problems are generally solved or circumvented, and technical advantages are generally achieved, by preferred embodiments of the present invention which present an apparatus for converting differential mode signals to single ended signals with reduced power consumption In accordance with a preferred embodiment of the present invention, a circuit comprising a current mode logic (CML) single ended converter having a differential mode input and a single ended output, the single ended converter containing circuitry to convert a differential mode signal into a single ended signal, and an output transistor coupled to the single ended output, the output transistor to set the single ended output to a logic state to a specified value.

In accordance with another preferred embodiment of the present invention, a circuit comprising a current mode logic (CML) single ended converter having a differential mode input and a single ended output, the single ended converter used for converting a differential mode signal into a single ended signal, and an output regulator circuit coupled to the single ended output, the output regulator circuit used for setting the single ended output to a logic state to a specified value when the CML single ended converter is in standby.

An advantage of a preferred embodiment of the present invention is that when the converter is in standby or is not being used, the input to the single ended buffer has a defined value. Therefore, there is a defined state at the input to the single ended buffer.

A further advantage of a preferred embodiment of the present invention is that since there is a defined state at the input to the single ended buffer, once the defined state is propagated through the buffer, there is no further state changes. Hence, there is no current flow when the converter is in standby.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a current mode logic signal to CMOS logic signal converter. The invention may also be applied, however, to other situations wherein a differential mode signal is to be converted into a single ended signal.

Figure 1:
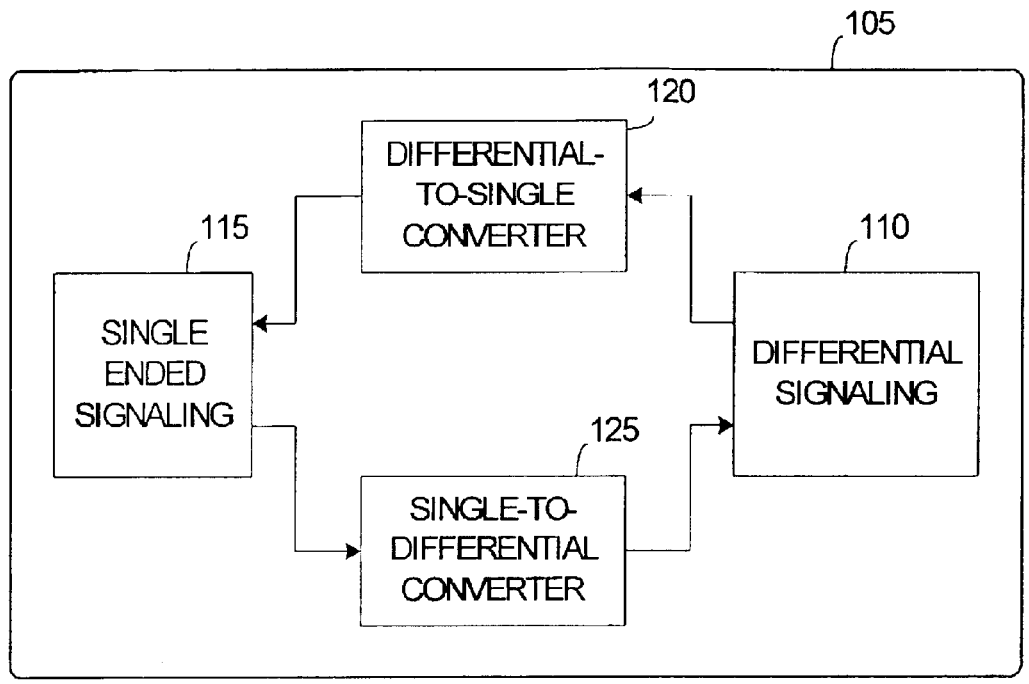
FIG. 1 is a diagram of a logic circuit containing sub-circuits both differential mode and single ended mode signaling and signal converters.

With reference now to FIG. 1, there is shown a diagram illustrating a logic circuit 105 that has sub-circuits 110 and 115 that uses differential mode signaling and single ended mode signaling respectively. The sub-circuits 110 and 115 also communicate to one another. Unfortunately, the signaling modes used by the sub-circuits are incompatible and a converter is needed to perform a translation. A differential-to-single converter 120 is needed to allow signals from sub-circuit 110 to be understood by sub-circuit 115 and a single-to-differential converter 125 is needed for signals from sub-circuit 1115 going to sub-circuit 110. If the communications is always one way (for example, from the sub-circuit 110 to the sub-circuit 115), then only one of the two converters (the differential-to-single converter 120) is needed.

As illustrated in FIG. 1, the sub-circuits 110 and 115 may be a part of the logic circuit 105 and these particular sub-circuits are the only ones that need to exchange signals. If this is the case, then there may be other sub-circuits that are coupled to the sub-circuits 110 and 115 but are not shown in the figure. Alternatively, the subcircuits 110 and 115 may be the only circuits (other than the converters 120 and 125) in the logic circuit 105.

Figure 2:
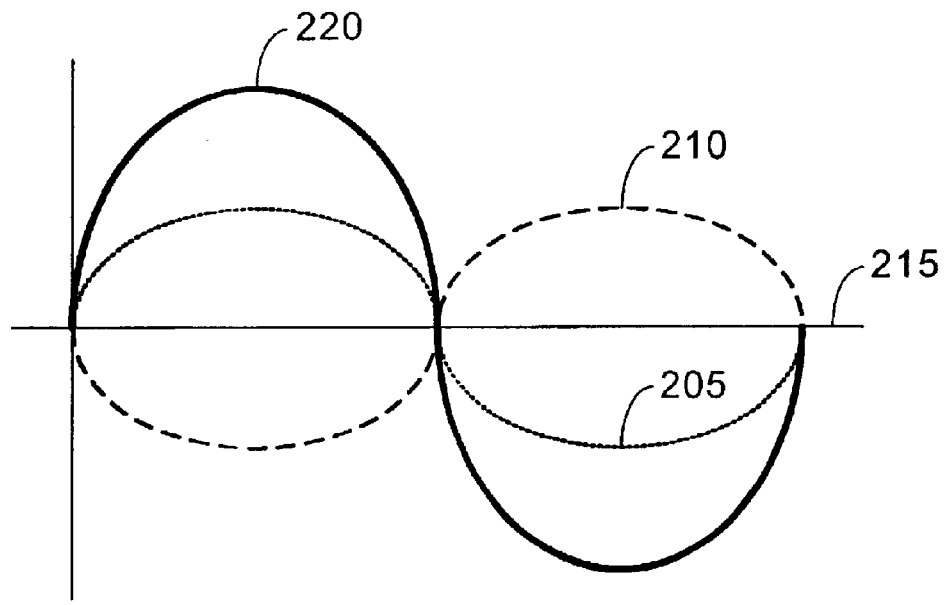
FIG. 2 is a data plot displaying a differential mode signal and an equivalent single ended mode signal.

With reference now to FIG. 2, there is shown a data plot illustrating a, differential mode signal (displayed as a two component signals, a first signal 205 and a second signal 210) and a signal 215 representing an offset of the differential mode signal. For example, if the voltage swing of the differential mode signal as displayed in FIG. 2 is from 1.8 volts to 0.0 volts, then the offset (displayed by signal 215) would be at approximately 0.9 volts. As discussed previously, a differential mode signal is made up of a two component signals, a first signal (for example, the first signal 205) and a second signal (for example, the second signal 210). According to the definition of a differential mode signal, the first signal is the complement of the second signal and the signal that is being carried in differential mode (for example, a signal 220) can be calculated by subtracting the second signal from the first signal. In other words, $V_{SIGNAL} = V_{FIRST} - V_{SECOND}$, where $V_{FIRST}$ and $V_{SECOND}$ are the component signals and $V_{SIGNAL}$ is the signal information is actually being carried in differential mode.

Figure 3:
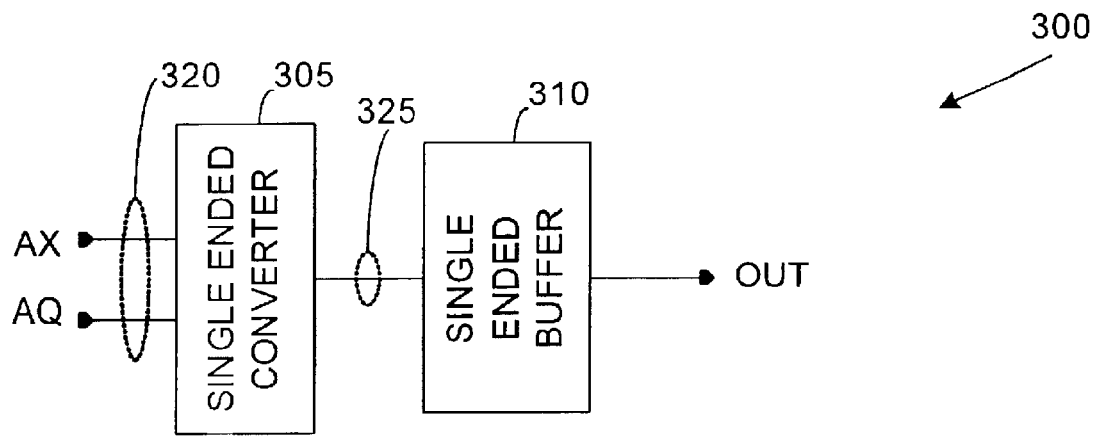
FIG. 3 is a diagram of a high level view of a design for a differential mode to single ended mode converter.

With reference now to FIG. 3, there is shown a diagram illustrating a high-level block diagram of a generic design for a differential mode to single ended mode converter (DMSMC) 300. The DMSMC 300 includes a single ended converter 305 whose function includes converting a differential mode input (labeled "AX" and "AQ") into a single ended signal. A single ended buffer 310 may be optionally coupled to the output of the single ended converter 305. Note that the single ended buffer 310 is not necessary to the proper operation of the DMSMC 300 and is displayed to represent single ended logic that may be attached to the output of the DMSMC 300. Additionally, it may be possible to replace the single ended buffer 310 with a series of single ended buffers or single ended inverters.

Figure 4:
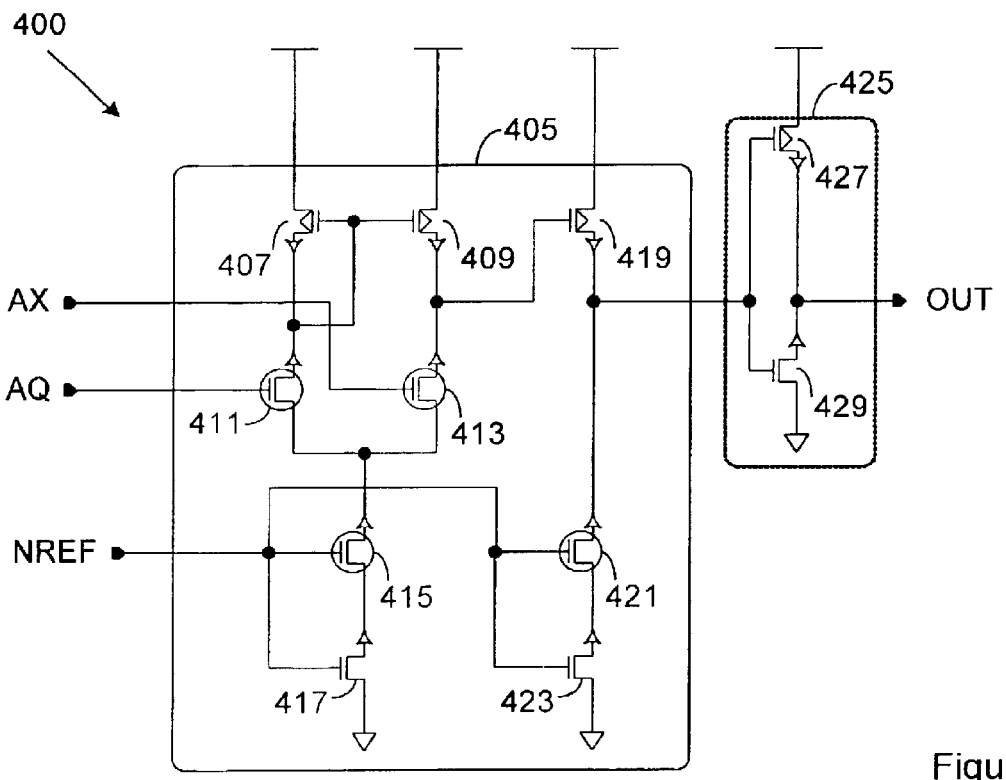
FIG. 4 is a schematic diagram of a prior art differential mode to single ended mode converter.

With reference now to FIG. 4, there is shown a diagram illustrating a schematic view of a prior art design for a DMSMC 400. The DMSMC 400 includes a single ended converter 405 that is basically a current mode logic (CML) differential amplifier with a current mirror load complete with built-in a single ended conversion. The single ended converter 405 has as input, a differential mode signal "AQ" and "AX" (a positive and a negative signal). Each of the two portions of the differential mode signal is coupled to a gate of an N-channel MOSFET (metal-oxide semiconductor field effect transistor) (for example, transistors 411 and 413 respectively). The drains of the transistors 411 and 413 are coupled to the drains of P-channel MOSFET transistors 407 and 409, which in turn have their sources coupled to a voltage supply, for example, VDD. The P-channel MOSFET transistors 407 and 409 have their gates coupled and to the drain of transistor 411.

Also, a reference current source, built out of transistors 415 and 417 with a reference voltage level coupled to their gates, is coupled to the sources of the transistor 411 and 413. The reference current source is used to provide a reference current level to specify a current flow whenever a current path is created from the voltage supply down to substrate ground.

The single ended converter 405 further includes an additional P-type MOSFET transistor 419 which has its gate coupled to the drains of transistors 409 and 413. A second reference current source, created from transistors 421 and 423 is coupled to the drain of the transistor 419. Output for the single ended converter 405 is taken from the drain of the transistor 419.

Coupled to the output of the single ended converter 405 is a single ended buffer 425. Note that as discussed above, the presence of the single ended buffer 425 is optional and is meant to show how single ended logic may be attached to the single ended converter 405. The single ended buffer 425 is built from a pair of transistors, a P-channel MOSFET 427 and an N-type MOSFET 429. The drains of the transistors 427 and 429 are coupled together to form the output of the single ended buffer 425, while the input to the single ended buffer 425 is applied to the gates of the transistors 427 and 429. The source of the transistor 427 is connected to a voltage supply while the source of the transistor 429 is coupled to substrate ground.

As discussed above, when the DMSMC 400 is in standby, the input to the single ended buffer 425 may become undefined, i.e., the gates of the transistors 427 and 429 have an undefined value. When the DMSMC 400 is in standby, NREF may be turned to zero potential. With its input becoming undefined, the transistors in the single ended buffer 425 (transistors 427 and 429) may be turned partially on. Being in the partially on state may create current path from the voltage supply to substrate ground. This results in current flow during standby, also commonly referred to as static current flow. Normally, when the input to the transistors in the single ended buffer 425 is defined (either logic state high or logic state low), one of the two transistors is on and the other transistor is off, therefore, the current path is broken and very little to no current flows.

It is desirable to have zero or approximately zero current flow when a circuit is in standby. Zero or negligible current flow can greatly reduce power consumption and hence battery life if a circuit is used in a battery powered device. Additionally, undefined states are typically not desired in a logic circuit since they may cause improper operation of the circuit. Therefore, the DMSMC 400 as illustrated in FIG. 4 has both undesired characteristics.

Figure 5:
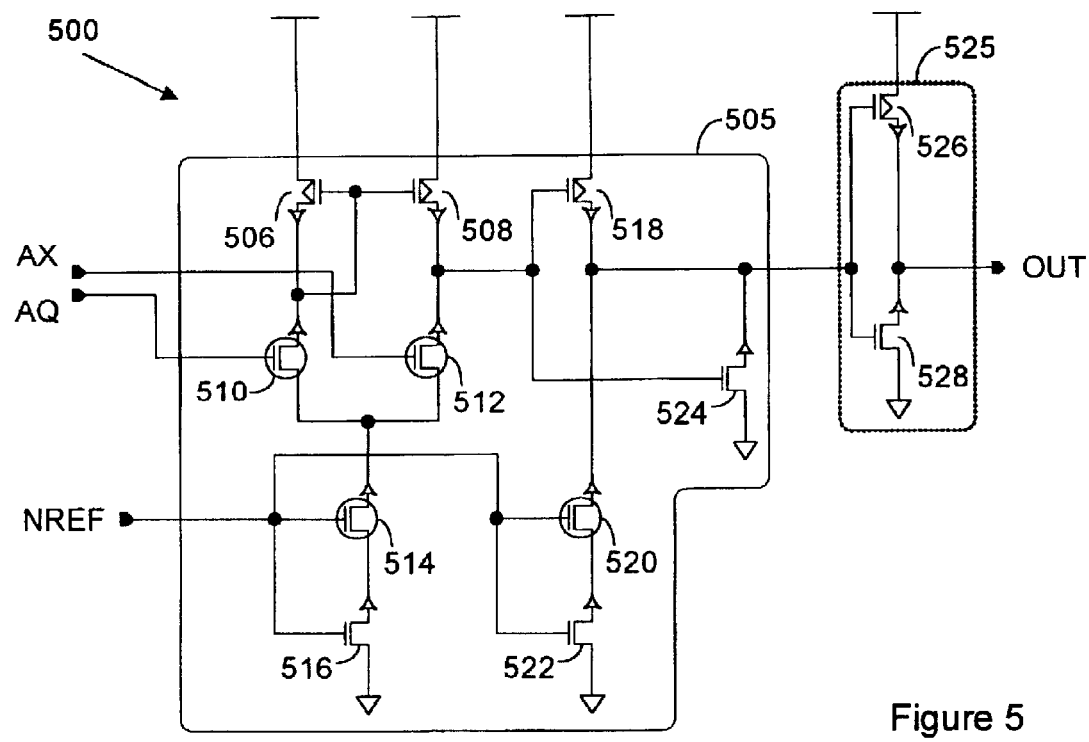
FIG. 5 is a schematic diagram of a differential mode to single ended mode converter with reduced power consumption, according to a preferred embodiment of the present invention.

With reference now to FIG. 5, there is shown a diagram illustrating a schematic diagram of a DMSMC 500 with reduced power consumption wherein an output of the DMSMC 500 has a low signal value when it is in standby, according to a preferred embodiment of the present invention. The DMSMC 500 generally follows the structure of a generic DMSMC as displayed in FIG. 3, with a single ended converter 505 and an optional single ended buffer 525 which may be representative of single ended logic coupled to the DMSMC 500.

According to a preferred embodiment of the present invention, the single ended converter 505 may be constructed out of a combination of N-channel and P-channel MOSFETs. An input signal to the single ended converter 505 may be in the form of a differential signal pair, for example, "AX" and "AQ", representing the component signals of a differential mode input signal "A". Each one of the two portions of the differential mode input signal may be coupled to a gate of a transistor (for example, N-channel MOSFETs 510 and 512), wherein the voltage values on the input signal can control the state of the transistors 510 and 512. The two transistors 510 and 512 have drains that can be coupled to drains of corresponding transistors (for example, P-channel MOSFET transistors 506 and 508) while the sources of the two transistors 510 and 512 may be coupled together and to a reference current source. The two transistors 506 and 508 have sources that may be coupled to a voltage supply, such as VDD. Additionally, the two transistors 506 and 508 have gates that may be coupled to one another and to the drain of the transistor 510.

The reference current source, coupled to the sources of the two transistors 510 and 512 can be created from a pair of transistors 514 and 516 that are coupled in serial fashion with the drain of transistor 516 coupled to the source of transistor 514. The gates of the two transistors 514 and 516 may be coupled to a reference voltage level, for example, NREF. The reference current source, when a current path exists will draw a fixed amount of current through the path.

An additional transistor, transistor 518, preferably a P-channel MOSFET with a source coupled to a voltage supply and a drain coupled to a second reference current source, has a gate that may be coupled to the drain of transistor 508. The second reference current source is preferably (but not necessarily) essentially identical to the reference current source that is coupled to transistors 510 and 512. The output of the single ended converter 505 is preferably at the drain of the transistor 518.

An output transistor 524 may then be coupled to the output of the single ended converter 505. According to a preferred embodiment of the present invention, the output transistor 524 is an N-channel MOSFET with its drain coupled to the output of the single ended converter and its source coupled to substrate ground. The gate of the output transistor 524 may be coupled to the drain of the transistor 508.

With the output transistor 524 present in the single ended converter 505 as illustrated, then when the single ended converter 505 is in standby, the output transistor 524 is on (therefore a path exists between the output of the single ended converter 505 and substrate ground) and the output of the single ended converter 505 is pulled down to substrate ground. Therefore, when the single ended converter 505 is in standby, its output has a defined state, namely a low logic value.

The DMSMC 500, as shown in FIG. 5, may also feature an optional single ended buffer 525. The single ended buffer 525 may be representative of single ended logic that may be attached to the single ended converter 505. According to a preferred embodiment of the present invention, a single ended buffer may be created out of two transistors, a P-channel MOSFET 526 and an N-channel MOSFET 528, which may have their drains coupled together as well as their gates. The gates of the two transistors may serve as input to the single ended buffer 525 while the drains of the two transistors may serve as output. The source of the P-channel MOSFET may be coupled to a voltage supply while the source of the N-channel MOSFET may be coupled to substrate ground.

With the output of the single ended converter 505 pulled down to substrate ground, the input to the single ended buffer 525 is a logic low. With a defined logic level at its input, the output of the single ended buffer 525 is also a defined logic level. Additionally, with a defined logic level at its input, one of the two transistors 526 and 528 may be off while the other may be on. This may prevent the creation of a current path through the two transistors 526 and 528, implying that zero (or very small) current flows when the DMSMC 500 is in standby.

Figure 6:
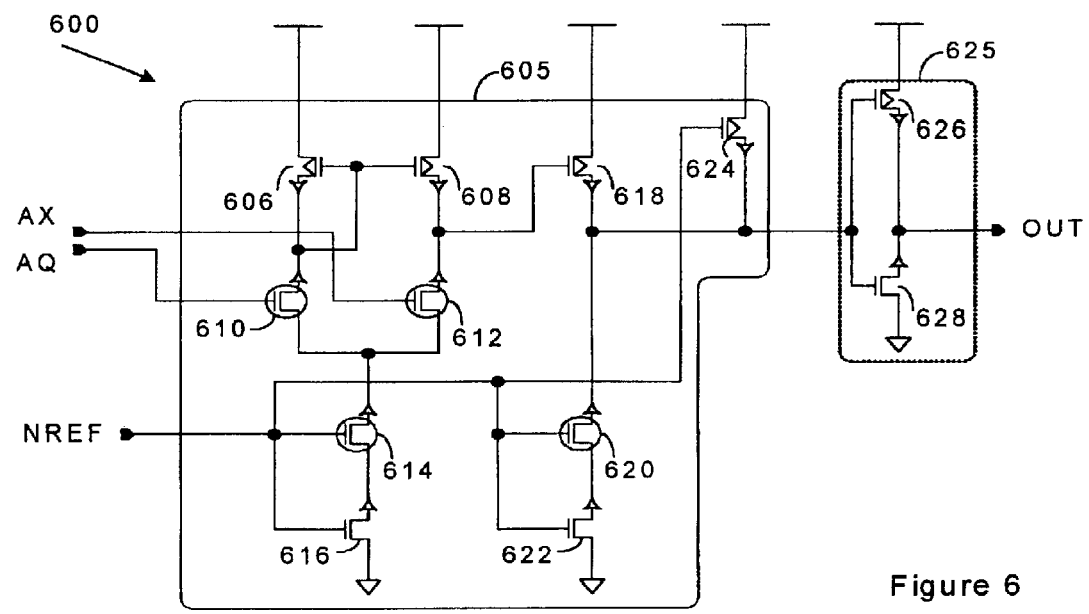
FIG. 6 is a schematic diagram of a differential mode to single ended mode converter with reduced power consumption, according to a preferred embodiment of the present invention.

With reference now to FIG. 6, there is shown a diagram illustrating schematic diagram of a DMSMC 600 with reduced power consumption wherein an output of the DMSMC 600 has a high signal value when it is in standby, according to a preferred embodiment of the present invention. The design of the DMSMC 600 may share many similarities with the design of the DMSMC 500 (FIG. 5), in that it follows the general structure of a generic DMSMC 300 (FIG. 3). Additionally, the DMSMC 600 may feature an optional single ended output buffer 625, similar to the DMSMC 500. Also, like the single ended converter 505 (FIG. 5), the single ended converter 605 may feature an output transistor 624.

According to a preferred embodiment of the present invention, the output transistor 624 is a P-channel MOSFET. The output transistor 624 may have its drain coupled to the single ended converter's output, while its source may be coupled to a voltage supply, such as VDD. The output transistor 624 also has a gate that may be coupled to a reference voltage, such as NREF, that may also be used to provide a reference voltage for reference current sources used in other parts of the single ended converter 605.

The output transistor 624 may operate in the following manner. When the single ended converter 605 is in standby, the reference voltage NREF turns on the output transistor 624, which may create a path from the voltage supply to the output of the single ended converter 605. The path may then pull the output of the single ended converter 605 to a voltage potential equal to that of the voltage supply or a high logic value. Again, with a defined logic state, the single ended buffer 625 (or any other single ended circuitry that is attached to the single ended converter 605) will have a defined output and zero (or very small) current flow since a current path may not exist.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
   a current mode logic (CML) single ended converter having a differential mode input and a single ended output, the single ended converter containing circuitry to convert a differential mode signal into a single ended signal;
   an output transistor coupled to the single ended output, the output transistor to set the single ended output to a logic state to a specified value; and
   a single ended buffer coupled to the single ended output, the single ended buffer comprising an n-channel transistor coupled to a p-channel transistor.

2. The circuit of claim 1, wherein the CML single ended converter comprises:
   a first and a second transistor, each transistor having a second terminal coupled to a voltage supply;
   a third and a fourth transistor, the third transistor having a first terminal coupled to a first terminal of the first transistor, the fourth transistor having a first terminal coupled to a first terminal of the second transistor, each transistor having a third terminal coupled to an input signal of the differential mode input, and the third and fourth transistors having their second terminals coupled together; and
   a fifth transistor having a second terminal coupled to the voltage supply and a third terminal coupled to the first terminal of the fourth transistor.

3. The circuit of claim 2, wherein the first and second transistors having each of their third terminals coupled together and to the first terminal of the third transistor.

4. The circuit of claim 2, wherein the single ended output of the CML single ended circuit is at a first terminal of the fifth transistor.

5. The circuit of claim 2, wherein the second terminals of the third and fourth transistors is coupled to a first reference current source.

6. The circuit of claim 5, wherein the first terminal of the fifth transistor is coupled to a second reference current source.

7. The circuit of claim 6, wherein the first and second reference current source each comprises:
   a sixth transistor having a first terminal coupled to a second terminal of a seventh transistor and third terminal coupled to a reference voltage level; and
   the seventh transistor having a third terminals coupled to the reference voltage level.

8. The circuit of claim 7, wherein the first, second, and fifth transistors are P-channel MOSFETs (metal-oxide semiconductor field effect transistors), and the third and fourth are N-channel MOSFETs.

9. The circuit of claim 7, wherein the transistors in the first and second reference current sources are N-channel MOSFETs.

10. The circuit of claim 2, wherein the first terminal is a transistor's drain terminal, the second terminal is the transistor's source terminal, and the third terminal is the transistor's gate terminal.

11. A circuit comprising:
    a current mode logic (CML) single ended converter having a differential mode input and a single ended output, the single ended converter containing circuitry to convert a differential mode signal into a singe ended signal; and
    an output transistor coupled to the single ended output, the output transistor to set the single ended output to a logic state to a specified value, wherein the output transistor has a second terminal coupled to a voltage supply and a third terminal coupled to a reference voltage level.

12. The circuit of claim 11, wherein the output transistor creates a conductive path to a voltage supply when the CML single ended converter is in standby.

13. The circuit of claim 11, wherein the voltage supply is at a voltage potential that is within specifications for a high logic value.

14. A circuit comprising:
    a current mode logic (CML) single ended converter having a differential mode input and a single ended output, the single ended converter containing circuitry to convert a differential mode signal into a single ended signal, wherein the CML single ended converter comprises:
    a first and a second transistor, each transistor having a second terminal coupled to a voltage supply;
    a third and a fourth transistor, the third transistor having a first terminal coupled to a first terminal of the first transistor, the fourth transistor having a first terminal coupled to a first terminal of the second transistor, each transistor having a third terminal coupled to an input signal of the differential mode input, and the third and fourth transistors having their second terminals coupled together; and
    a fifth transistor having a second terminal coupled to the voltage supply and a third terminal coupled to the first terminal of the fourth transistor; and
    an output transistor coupled to the single ended output the output transistor to set the single ended output to a logic state to a specified value, wherein the output transistor has a second terminal coupled to substrate ground and third terminal coupled to the third terminal of the fifth transistor.

15. The circuit of claim 14, wherein the output transistor creates a conductive path to substrate ground when the CML single ended converter is in standby.

16. A circuit comprising:
    a current mode logic (CML) single ended converter having a differential mode input and a single ended output, the single ended converter used for converting a differential mode signal into a single ended signal; and
    an output regulator circuit coupled to the single ended output, the output regulator circuit used for setting the single ended output to a logic state of a specified value when the CML single ended converter is in standby.

17. The circuit of claim 16, wherein a differential mode signal has two component signals, a first and a second signal, and wherein the CML single ended converter converts the differential mode input into the single ended output by subtracting the second signal of the differential mode input from the first signal of the differential mode input.

18. The circuit of claim 16, wherein the output regulator circuit couples the single ended output to a specified voltage value when the CML single ended converter is in standby.

19. The circuit of claim 18, wherein the output regulator circuit couples the single ended output to a voltage supply that in the range of a high logic value.

20. The circuit of claim 19, wherein the output regulator circuit is a P-channel MOSFET (metal oxide semiconductor field effect transistor) having a drain terminal coupled to the single ended output.

21. The circuit of claim 18, wherein the output regulator circuit couples the single ended output to a substrate ground.

22. The circuit of claim 21, wherein the output regulator circuit is an N-channel MOSFET (metal oxide semiconductor field effect transistor) having a drain terminal coupled to the single ended output.

23. The circuit of claim 16 and further comprising a single ended buffer coupled to the single ended output, wherein the output regulator is used to substantially turn off any static current in the single ended buffer when the CML single ended converter is in standby.

24. The circuit of claim 11, wherein the CML single ended converter comprises:
  a first and a second transistor, each transistor having a second terminal coupled to a voltage supply;
  a third and a fourth transistor, the third transistor having a first terminal coupled to a first terminal of the first transistor, the fourth transistor having a first terminal coupled to a first terminal of the second transistor, each transistor having a third terminal coupled to an input signal of the differential mode input, and the third and fourth transistors having their second terminals coupled together; and
  a fifth transistor having a second terminal coupled to the voltage supply and a third terminal coupled to the first terminal of the fourth transistor.

25. A circuit comprising:
  a current mode logic (CML) single ended converter having a differential mode input and a single ended output, the single ended converter containing circuitry to convert a differential mode signal into a single ended signal, the CML single ended converter operable to be placed in a standby mode;
  an output transistor coupled to the single ended output, the output transistor to set the single ended output to a logic state to a specified value when the CML single ended converter is in the standby mode; and
  a single ended buffer coupled to the single ended output, wherein the output transistor substantially eliminate static current in the single ended buffer when the CML single ended converter is in the standby mode.

26. The circuit of claim 25, wherein the CML single ended converter comprises:
  a first and a second transistor, each transistor having a second terminal coupled to a voltage supply,
  a third and a fourth transistor, the third transistor having a first terminal coupled to a first terminal of the first transistor, the fourth transistor having a first terminal coupled to a first terminal of the second transistor, each transistor having a third terminal coupled to an input signal of the differential mode input, and the third and fourth transistors having their second terminals coupled together; and
  a fifth transistor having a second terminal coupled to the voltage supply and a third terminal coupled to the first terminal of the fourth transistor.

27. A circuit comprising:
  a current mirror including a first input node and a second input node, the first and second input nodes operable to receive a differential input signal;
  a reference current source coupled to the current mirror, the reference current source operable to be placed in a standby mode;
  a transistor with a first terminal coupled to the current mirror and a second terminal coupled to an output node, the output node operable to carry a single ended signal having a logical value based on the differential input signal; and
  an output transistor with a current path coupled seen the output node and a power supply node that is held at a supply potential the output transistor operable to set the output node to the supply potential when the reference current source is in the standby mode.

28. The circuit of claim 27 wherein the output transistor comprises an n-channel transistor with a current path coupled between the output node and a ground node that is held at a ground potential.

29. The circuit of claim 28 wherein the transistor comprises a p-channel transistor with a current path coupled between a VDD and the output node, the transistor further including a gate coupled to a gate of the output transistor.

30. The circuit of claim 27 wherein the reference current source includes a reference voltage node, the reference current source operable to be placed in the standby mode when a zero potential is placed on the reference voltage node.

31. The circuit of claim 30 wherein the output transistor comprises an n-channel transistor with a source/drain current path coupled between the output node and a VDD node that is held at a VDD potential, the output further including a gate coupled to the reference voltage node.

32. The circuit of claim 27 and further comprising a single-ended input buffer with an input coupled to the output node.

33. The circuit of claim 32 wherein the single-ended input buffer comprises a CMOS buffer that includes a p-channel transistor with a source coupled to a VDD node and an n-channel transistor with a source coupled to a ground node and a drain coupled to a drain of the p-channel transistor, the p-channel transistor and the n-channel transistor both including a gate coupled to the output node, wherein power supply node comprises one of the ground node or the VDD node.

* * * * *